(12) United States Patent
Reznicek et al.

(10) Patent No.: US 11,081,543 B2
(45) Date of Patent: Aug. 3, 2021

(54) MULTI-SPHEROID BEOL CAPACITOR

(71) Applicant: International Business Machines Corporation, Armonk, NY (US)

(72) Inventors: Alexander Reznicek, Troy, NY (US); Praneet Adusumilli, Somerset, NJ (US); Shanti Pancharatnam, Albany, NY (US); Oscar Van Der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 517 days.

(21) Appl. No.: 15/934,147

(22) Filed: Mar. 23, 2018

(65) Prior Publication Data

US 2019/0296103 A1 Sep. 26, 2019

(51) Int. Cl.
*H01L 23/522* (2006.01)
*H01L 29/66* (2006.01)
*H01L 49/02* (2006.01)

(52) U.S. Cl.
CPC .......... *H01L 28/91* (2013.01); *H01L 23/5223* (2013.01); *H01L 28/92* (2013.01); *H01L 29/66181* (2013.01)

(58) Field of Classification Search
CPC ................. H01L 23/5223; H01L 28/91; H01L 29/66181; H01L 28/92; H01L 27/10829
See application file for complete search history.

(56) References Cited

U.S. PATENT DOCUMENTS

| | | | |
|---|---|---|---|
| 8,492,874 B2* | 7/2013 | Lan | H01L 28/87 |
| | | | 257/534 |
| 9,831,248 B1* | 11/2017 | Zang | H01L 28/91 |
| 2019/0371803 A9* | 12/2019 | Kanakamedala | |
| | | | H01L 27/11556 |

* cited by examiner

*Primary Examiner* — Mark W Tornow
*Assistant Examiner* — Abbigale A Boyle
(74) *Attorney, Agent, or Firm* — Patterson + Sheridan, LLP

(57) ABSTRACT

Method and apparatus for a capacitive structure. The capacitive structure includes a material stack having a deep trench formed therein. The material stack includes alternating vertical and semi-ovoid sidewall surfaces. The material stack further includes alternating metallization layers and dielectric layers. At least one of the semi-spheroidal sidewall surfaces is formed in a sidewall of at least one of the dielectric layers in the deep trench. At least one of the vertical sidewall surfaces is a sidewall surface of at least one metallization layer in the deep trench.

6 Claims, 11 Drawing Sheets

MULTI-SPHEROID BEOL CAPACITOR

BACKGROUND

The present application relates to a semiconductor structure and a method of forming the same, and more specifically, to a semiconductor structure including a back-of-the-line (BEOL) capacitor having a high capacity and located overlying front-of-the-line (FEOL) semiconductor-based circuitry in a bulk semiconductor substrate as well as a method of forming the same.

In the semiconductor industry, each circuit needs capacitors. The capacitors may be utilized in a stand-alone semiconductor circuit such as, for example, a dynamic random access memory (DRAM) circuit, as an embedded circuit component of a semiconductor chip that also includes other semiconductor circuits such as a processor core or other logic circuits. Particularly, embedded capacitors may be used in conjunction with an embedded memory device, for example, an embedded dynamic random access memory (eDRAM) cell, a passive component of a radio frequency (RF) circuit, or a decoupling capacitor that provides a stable voltage supply in a semiconductor circuit.

Typically, capacitors are formed into a semiconductor handle substrate of a semiconductor-on-insulator (SOI) substrates as FEOL circuits; the semiconductor handle substrate is located beneath a buried insulator layer and an active semiconductor device layer of the SOI substrate. SOI substrates have been employed in the semiconductor industry for performance benefits due to reduced capacitive coupling between semiconductor devices and the semiconductor handle substrate.

Despite the benefits that SOI substrates provide in eDRAM manufacturing, there is an ongoing desire to replace SOI substrates with bulk semiconductor substrates since bulk semiconductor substrates are cheaper and are more readily available. Notably, there is a need for providing a capacitor that has a high capacity and that is formed in (FEOL) semiconductor-based circuitry in a bulk semiconductor substrate.

SUMMARY

According to one embodiment of the present invention, a capacitive structure includes a material stack having a deep trench formed therein. The material stack includes alternating vertical and semi-spheroidal sidewall surfaces. The material stack further includes alternating metallization layers and dielectric layers. At least one of the semi-spheroidal sidewall surfaces is formed in a sidewall of at least one of the dielectric layers in the deep trench. At least one of the vertical sidewall surfaces is a sidewall surface of at least one metallization layer in the deep trench.

According to one embodiment of the present invention, a semiconductor structure includes a front-of-the-line semiconductor (FEOL) circuit layer. The semiconductor structure further includes a back-of-the-line (BEOL) capacitor. The BEOL capacitor has a deep trench formed in a material stack comprising alternating vertical and semi-ovoid sidewall surfaces. The material stack includes alternating metallization layers and dielectric layers. At least one of the semi-ovoid sidewall surfaces is formed in a sidewall of at least one of the dielectric layers in the deep trench. At least one of the vertical sidewall surfaces is a sidewall surface of at least one metallization layer in the deep trench. The material stack overlies the FEOL circuit layer.

According to one embodiment of the present invention, a method of forming a capacitive structure is provided. In one embodiment, the method may include first forming a deep trench having vertical sidewall surfaces and a horizontal bottom surface in a material stack, the material stack comprising alternating layers of dielectric material and metallization. The method may further include forming at least one pair of semi-spheroidal surfaces in sidewalls of at least one of the dielectric layers, wherein vertical sidewall surfaces are sidewall surfaces formed in at least one metallization layer in the deep trench.

DETAILED DESCRIPTION

Figure 1:
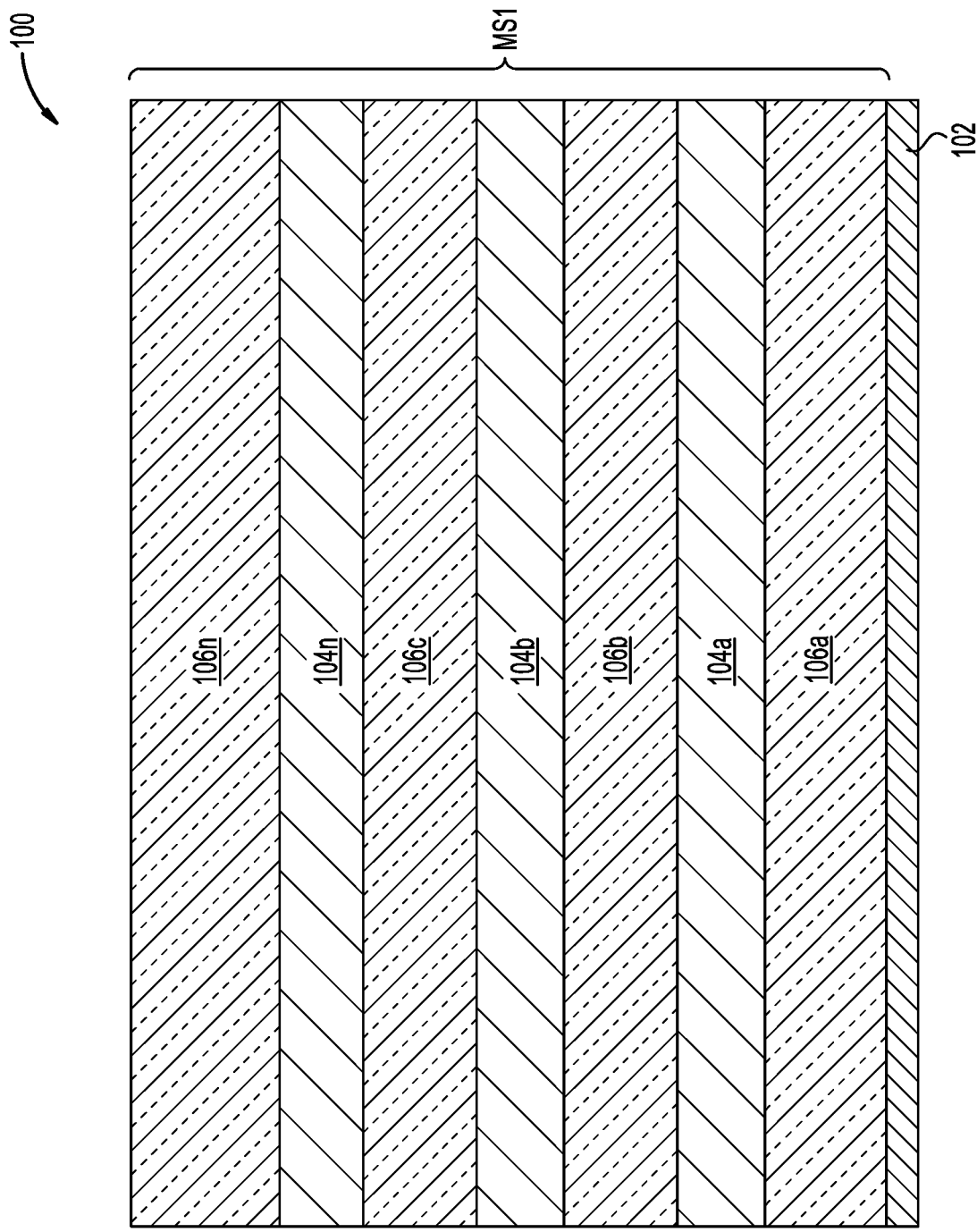
FIG. 1 is a cross sectional view of an exemplary base semiconductor structure that can be employed in the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene interconnect structures. The interconnect structures typically include copper, Cu, since Cu based interconnects provide higher speed signal transmission between large numbers of transistors on a complex semiconductor chip as compared with aluminum, Al, based interconnects.

The present application relates to a semiconductor structure and a method of forming the same. More particularly, the present application relates to a semiconductor structure forming a BEOL capacitor from alternating layers of metallization and ultralow-k dielectric layers (interconnect metallic region and/or metallic contact region) having a multi-spheroid shape and exhibiting high values of capacitance overlying FEOL circuitry of a bulk semiconductor substrate and a method of forming the same.

Referring first to FIG. 1, there is illustrated an exemplary semiconductor structure 100 that can be employed in the present application. Notably, the exemplary semiconductor structure shown in FIG. 1 includes, from bottom to top, a base front-end-of-the-line (FEOL) semiconductor circuit layer 102 of a bulk semiconductor substrate and a material stack MS1. The material stack MS1 includes alternating metallization layers (e.g., copper) 104a-104n and ultra-low-k dielectric layers 106a-106n. In accordance with the present application, each of the metallization layers (e.g., 104a) of the material stack MS1 is sandwiched between a lower dielectric layer (e.g., 106a) and an upper dielectric layer (e.g., 106d). Thus, the material stack MS1 includes 'n' number of metallization layers, wherein n is at least 1, and n+1 number of dielectric layers; the upper value of 'n' may vary and is used to determine the overall thickness of the semiconductor structure 100. By way of one example, four layers of dielectric, and three layers of metallization are illustrated within the material stack MS1 of FIG. 1.

Each metallization layer 104a-104n of the material stack MS1 has a first thickness, while each dielectric layer 106a-106n of the material stack MS1 has a second thickness that is typically greater than the first thickness, although the second thickness can also be smaller than the first thickness.

In one example, each metallization layer 104a-104n of the material stack MS1 may have a thickness from 20 nm to 300 nm, while dielectric layer 106a-106n of the stack MS1 may have a thickness from 20 nm to 400 nm. In one example, ultra low-k dielectric material layers 106a-106n may have a thickness from 50 nm to 1000 nm. Other thicknesses that are lesser than, or greater than, the aforementioned thickness range may also be employed in the present application for the thickness of ultra low-k dielectric material layers 106a-106n.

The material stack MS1 can be formed by alternating deposition of the ultra-low-k dielectric layers 106a-106n and the patterned metallization layers (e.g., copper) 104a-104n. FIG. 1 also shows the material stack MS1 after depositing a layer of ultra-low-k dielectric 106a upon a substrate (not shown). The substrate, which is not shown, may be composed of a semiconducting material, an insulating material, a conductive material or any combination thereof. When the substrate is composed of a semiconducting material, any material having semiconductor properties such as, for example, Si, SiGe, SiGeC, SiC, Ge alloys, III/V compound semiconductors or II/VI compound semiconductors, may be used. In addition to these listed types of semiconducting materials, the substrate that is located beneath the initial ultra-low-k dielectric layers 106a can be a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or any combination thereof including multilayers. When the substrate is a conductive material, the substrate may include, for example, poly-Si, an elemental metal, alloys of elemental metals, a metal silicide, a metal nitride or any combination thereof including multilayers.

The ultra-low-k dielectric layers 106a-106n may be composed of any interlevel or intralevel dielectric including inorganic dielectrics or organic dielectrics. In one embodiment, the ultra-low-k dielectric layers 106a-106n may be non-porous. In another embodiment, the ultra-low-k dielectric layers 106a-106n may be porous. Some examples of suitable dielectrics that can be used as the ultra-low-k dielectric layers 106a-106n include, but are not limited to, SiO2, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

FIG. 1 also shows the material stack MS1 after depositing a layer of an interconnect metal or metal alloy and performing a reflow anneal for each of the metallization layers (e.g., copper) 104a-104n. As is shown, the deposited and reflowed metallization layer 104a overlays the ultra-low k dielectric layer 106a. The deposited and reflowed deposited and reflowed metallization layer 104a is formed by first depositing deposited and reflowed metallization layer 104a directly on the ultra-low k dielectric layer 106a and then performing a reflow anneal. The metal or metal alloy that may be employed in the present application includes copper (Cu), aluminum (Al), or a Cu—Al alloy. The metal or metal alloy can be formed by a deposition process including PVD, chemical vapor deposition (CVD), plasma enhanced chemical vapor deposition (PECVD), sputtering, chemical solution deposition or plating.

Next, a reflow anneal is performed. In one embodiment, the reflow anneal is a thermal anneal. In one example, the reflow anneal may include a furnace anneal or a hot plate anneal. The reflow anneal may be performed at a temperature from 100° C. to 500° C. Other temperatures can also be employed so long as the selected reflow anneal temperature causes the reflow of the metal or metal alloy. The duration of the reflow anneal may vary depending upon the temperature used during the thermal anneal. In one embodiment and for a temperature from 100° C. to 500° C., the reflow anneal may be performed for a duration of 20 minutes to 3 hours.

The reflow anneal is typically performed in a nitrogen-containing ambient or a hydrogen-containing ambient. The nitrogen-containing ambients that can be employed in the present application include, but are not limited to, N2, or NH3, and mixtures thereof. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, H2 can be used to dilute the nitrogen-containing ambient. Notwithstanding whether the nitrogen-containing ambient is employed neat or diluted, the content of nitrogen within the nitrogen-containing ambient employed in the present application is typically from 10% to 100%, with a nitrogen content within the nitrogen-containing ambient from 50% to 80% being more typical.

Forming the remaining ultra-low k dielectric layers (106b-106n) and the metallization layers (106b-106n) is repeated until the stack MS1 is completely formed.

Figure 2:
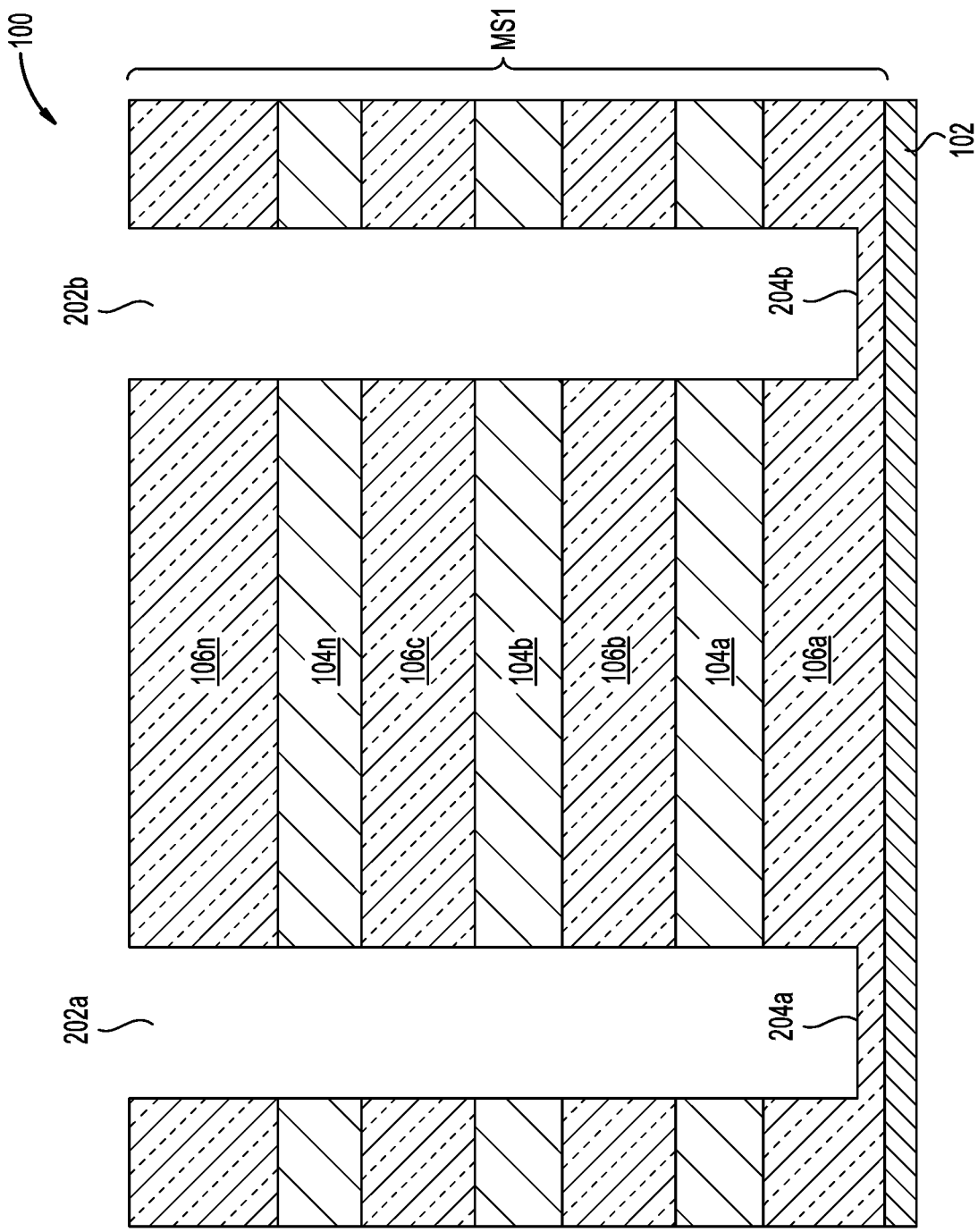
FIG. 2 is a cross sectional view of the exemplary semiconductor structure of FIG. 1 after forming at least one deep trench through all of the metallization layers and terminating on a sub-surface within the lower-most dielectric layer.

Referring now to FIG. 2, there is illustrated the exemplary semiconductor structure 100 of FIG. 1 after forming at least one deep trench 202a, 202b through all of the metallization layers 106a-106n and terminating on a sub-surface 204a, 204b within the lower-most dielectric layer 104a. The least one deep trench 202a, 202b can be formed utilizing a reactive-ion etch process. The at least one deep trench 202a, 202b may have a depth from 500 nm to 10 μm. Other depths for the at least one deep trench 202a, 202b are possible depending on the number of layers within the material stack MS1 and the thickness of the FEOL layer 102. The at least one deep trench 202a, 202b that is formed has sidewall surfaces that are vertical relative to the exposed sub-surface 204a, 204b of the lower-most dielectric layer 106a.

Figure 3:
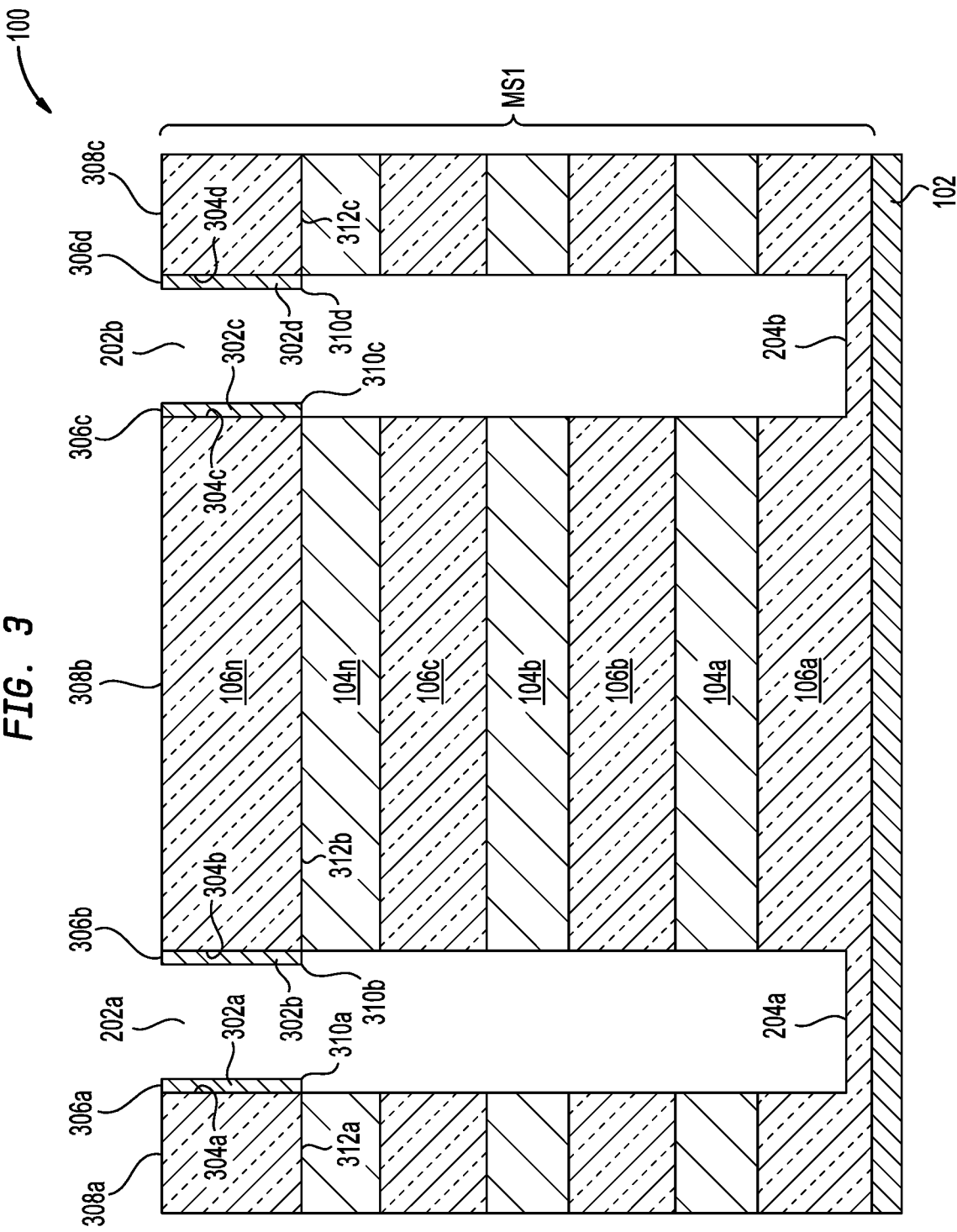
FIG. 3 is a cross sectional view of the exemplary semiconductor structure of FIG. 2 after forming hanging spacers on physically exposed sidewall surfaces of the upper-most dielectric layer within the deep trench.

Referring now to FIG. 3, there is illustrated the exemplary semiconductor structure 100 of FIG. 2 after forming hanging spacers 302a-302n on physically exposed sidewall surfaces 304a-304n of the upper-most dielectric layer 106n within the deep trench 202a, 202n. Each hanging spacer 302a-302n has a topmost surface 306a-306d that is coplanar with a topmost surface 308a, 308b, 308c of the upper-most dielectric layer 106n. In some embodiments and as shown in FIG. 3, each hanging spacer 302a-302n covers at least a portion of one of the physically exposed sidewall surfaces 304a-304n of the upper-most dielectric layer 106n. In such an embodiment, the bottommost surface 310a-310d of each hanging spacer 302a-302n is co-planar with a bottom surface 312a-312d of the upper-most dielectric layer 106n. The hanging spacer 302a-302n protects the exposed sidewall surfaces 304a-304n of the upper-most dielectric layer 106n from having a semi-spheroidal space formed in the sidewalls of the upper-most dielectric layer 106n during the processing step of FIG. 4 hereinbelow.

Each hanging spacer 302a-302n may be formed utilizing conventional techniques well known to those skilled in the art. In one example, each hanging spacer 302a-302n is formed by first forming a sacrificial dielectric material (not shown) such as, for example, an oxide or nitride, partially within the deep trench 202a, 202b. Next, a spacer dielectric material (not shown) is formed on all exposed surfaces of the exemplary semiconductor structure 100 utilizing a deposition process such as, for example, chemical vapor deposition (CVD) or plasma enhanced chemical vapor deposition (PECVD) and thereafter an etch is employed to remove the spacer dielectric material from all horizontal surfaces of the exemplary semiconductor structure 100. The dielectric spacer material that remains after the etch provides the hanging spacer 302a-302n. After etching, the entirety of the sacrificial dielectric material is removed from the deep trench 202a, 202b.

The spacer dielectric material that is used in providing the hanging spacer 302a-302n is composed of a different dielectric material than the sacrificial dielectric material. For example, and when the sacrificial dielectric material is composed of an oxide, the spacer dielectric material is composed of a nitride such as, for example, silicon nitride or silicon oxynitride. In another example, and when the sacrificial dielectric material is composed of a nitride, the spacer dielectric material is composed of an oxide such as, for example; silicon dioxide.

Each hanging spacer 302a-302n may have a width, as measured from one sidewall to an opposing sidewall, of from 6 nm to 20 nm. Other widths are possible and are not excluded from being used in the present application as the width of each hanging spacer 302a-302n as long as the other widths do not entirely pinch off the opening of the deep trench 202a, 202b.

Figure 4:
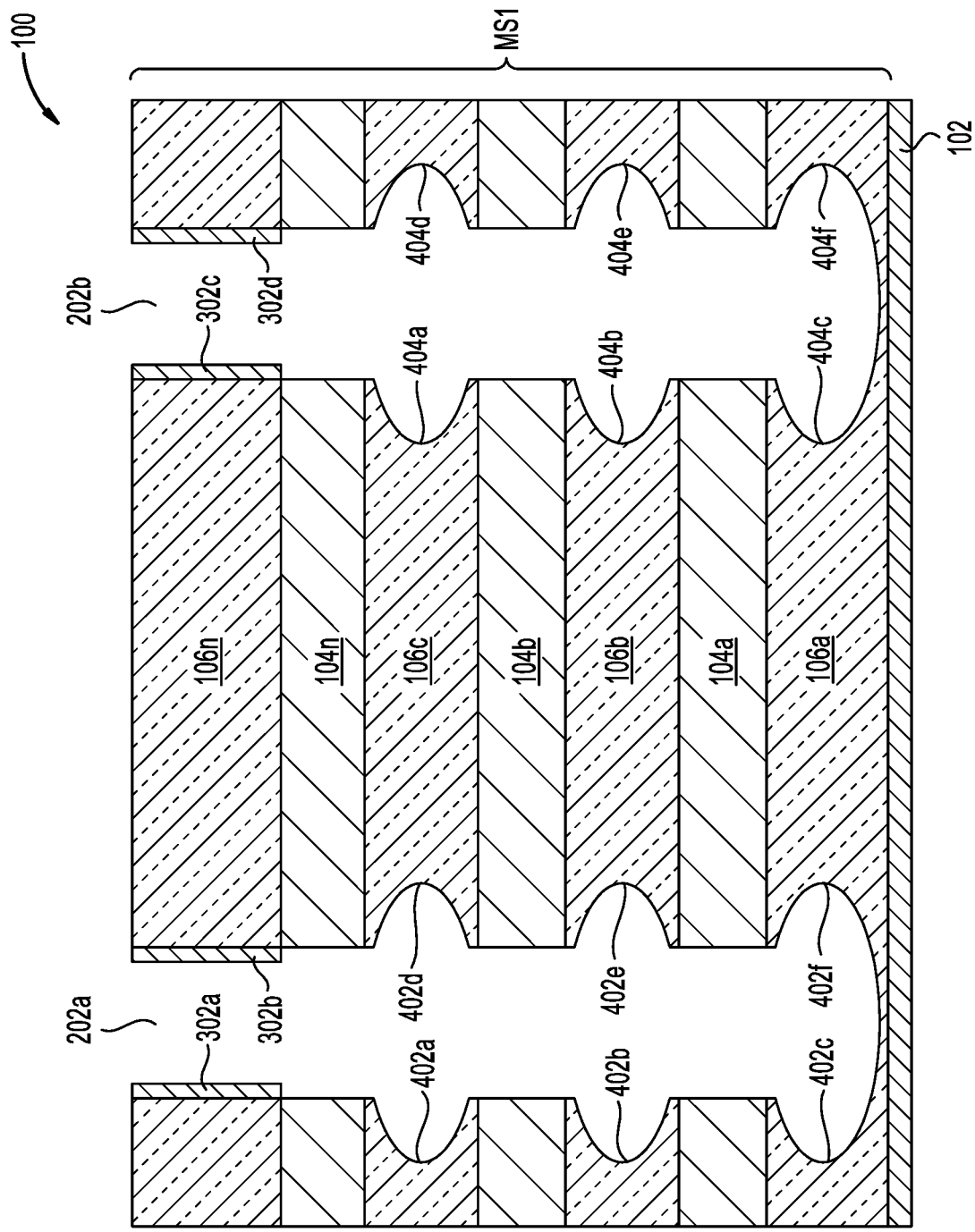
FIG. 4 is a cross sectional view of the exemplary semiconductor structure of FIG. 3 after performing a performing an O2/CO2/CO ash process and an HF-based wet clean process in the deep trench.

Referring now to FIG. 4, there is illustrated the exemplary semiconductor structure 100 of FIG. 3 after performing a O2/CO2/CO ash process and an HF-based wet clean process in the deep trench 202a, 202n that removes portions of the dielectric layer 106a-106n selective to each metallization layers 104a-104n, wherein the etched sidewall surfaces 304a-304n of the dielectric layers 106a-106n in the deep trench 202a, 202n have a semi-spheroidal sidewall surface 402a-402n, 404a-404n.

The term "spheroidal sidewall surface" is used in the present application to a denote sidewall surface that is non-vertical relative to a horizontal plane. In such an embodiment, half-spheroidal shaped regions can be formed between opposing spheroidal sidewall surfaces 402a-402n, 404a-404n within the deep trench 202a, 202n. In the present application, the hanging spacer 302a-302n serve as a mask during the ash etch, and as such, the ash process does not remove portions of the upper-most dielectric layer 106n. The ash process removes the remaining dielectric layers 106a-106c of the material stack MS1. In one example, the ash process that can be employed in the present application may be a O2/CO2/CO RIE.

Figure 5:
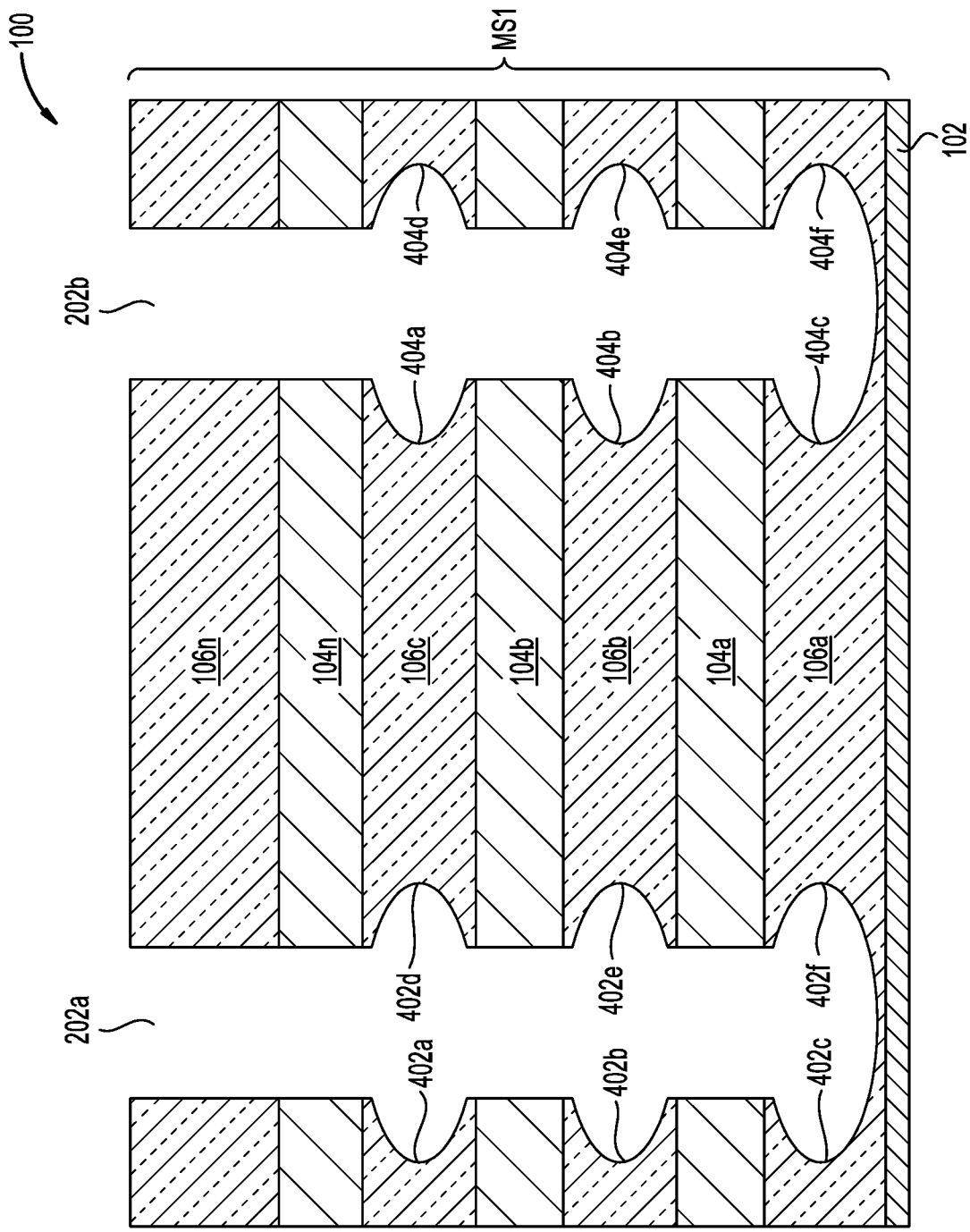
FIG. 5 is a cross sectional view of the exemplary semiconductor structure of FIG. 4 after removing each hanging spacer from the deep trench.

Referring now to FIG. 5, there is illustrated the exemplary semiconductor structure 100 of FIG. 4 after removing each hanging spacer 302a-302n from the deep trench 202a, 202n. The hanging spacers 302a-302n can be removed utilizing one or more material removal processes. The removal of the hanging spacers 302a-302n from the deep trench 202a, 202b exposes ultra-low-k dielectric surfaces within the deep trench 202a, 202n that is present in the material stack MS1.

Figure 6:
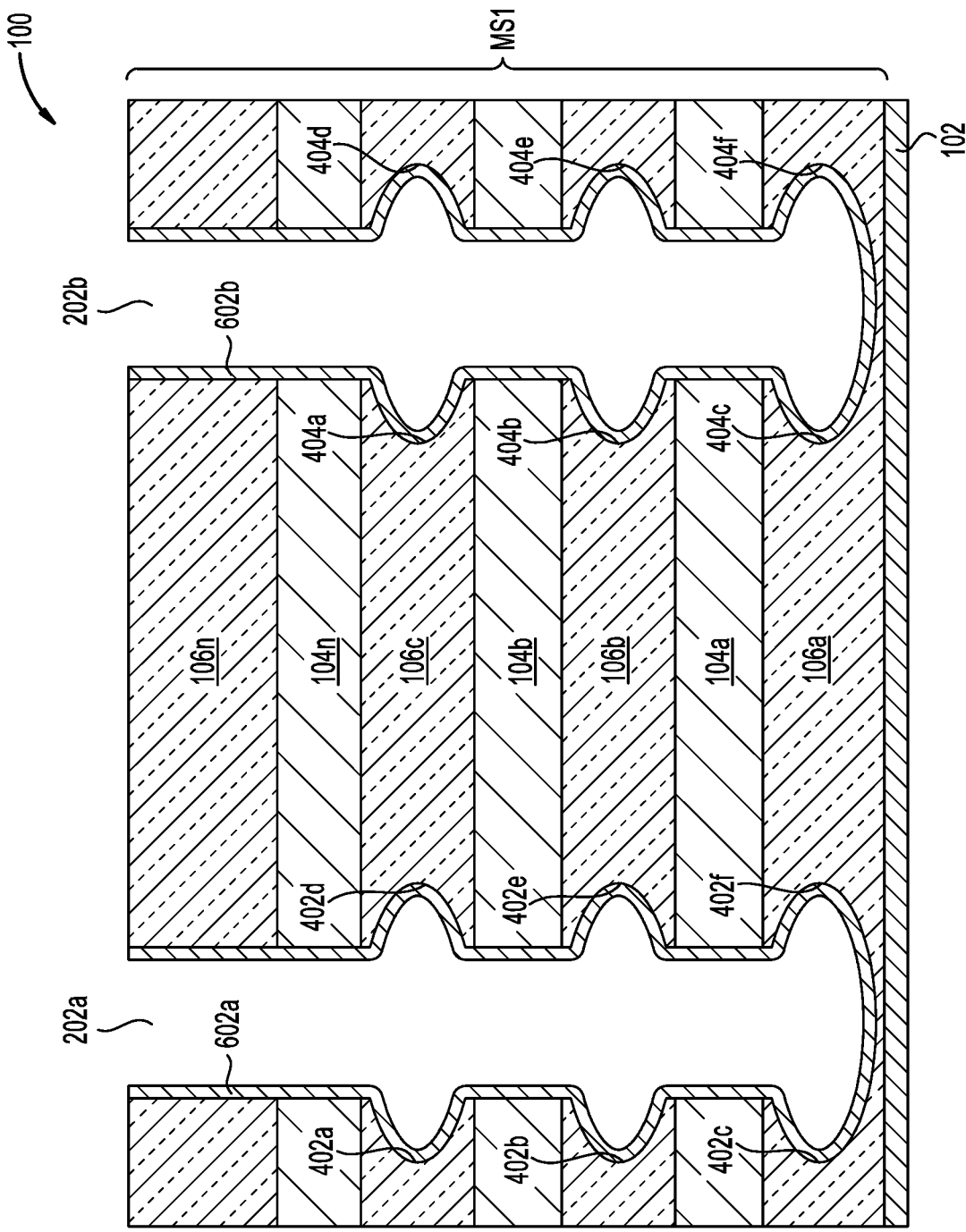
FIG. 6 is a cross sectional view of the exemplary semiconductor structure of FIG. 5 after forming a first conductive layer made of a diffusion barrier material and a reflow enhancement layer (not shown).

Referring now to FIG. 6, there is illustrated the exemplary semiconductor structure 100 of FIG. 5 after depositing a first conductive layer 602a, 602b made of a diffusion barrier material and a reflow enhancement layer (not shown). The first conductive layer 602a, 602b is formed as a continuous layer on the exposed sidewall surfaces 304a-304d of the upper-most dielectric layer 106n and along the semi-spheroidal sidewall surface 402a-402n, 404a-404n. The reflow enhancement layer (not shown) is a continuous layer that is formed on the diffusion barrier material 602a, 602b. In one embodiment, the reflow enhancement layer includes a ruthenium layer.

The diffusion barrier material 602a, 602b includes Ta, TaN, Ti, TiN, Ru, RuN, RuTa, RuTaN, W, WN or any other material that can serve as a barrier to prevent a conductive material such as copper from diffusing there through. In some embodiments, the diffusion barrier material may include a material stack of such diffusion barrier materials. In one example, the diffusion barrier may be composed of a stack of TaN and Ru.

The thickness of the first conductive layer 602a, 602b may vary depending on the deposition process used as well as the material employed. In some embodiments, the first conductive layer 602a, 602b may have a thickness from 2 nm to 20 nm; although other thicknesses for the first conductive layer 602a, 602b are contemplated and can be employed in the present application. The first conductive layer 602a, 602b can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 7:
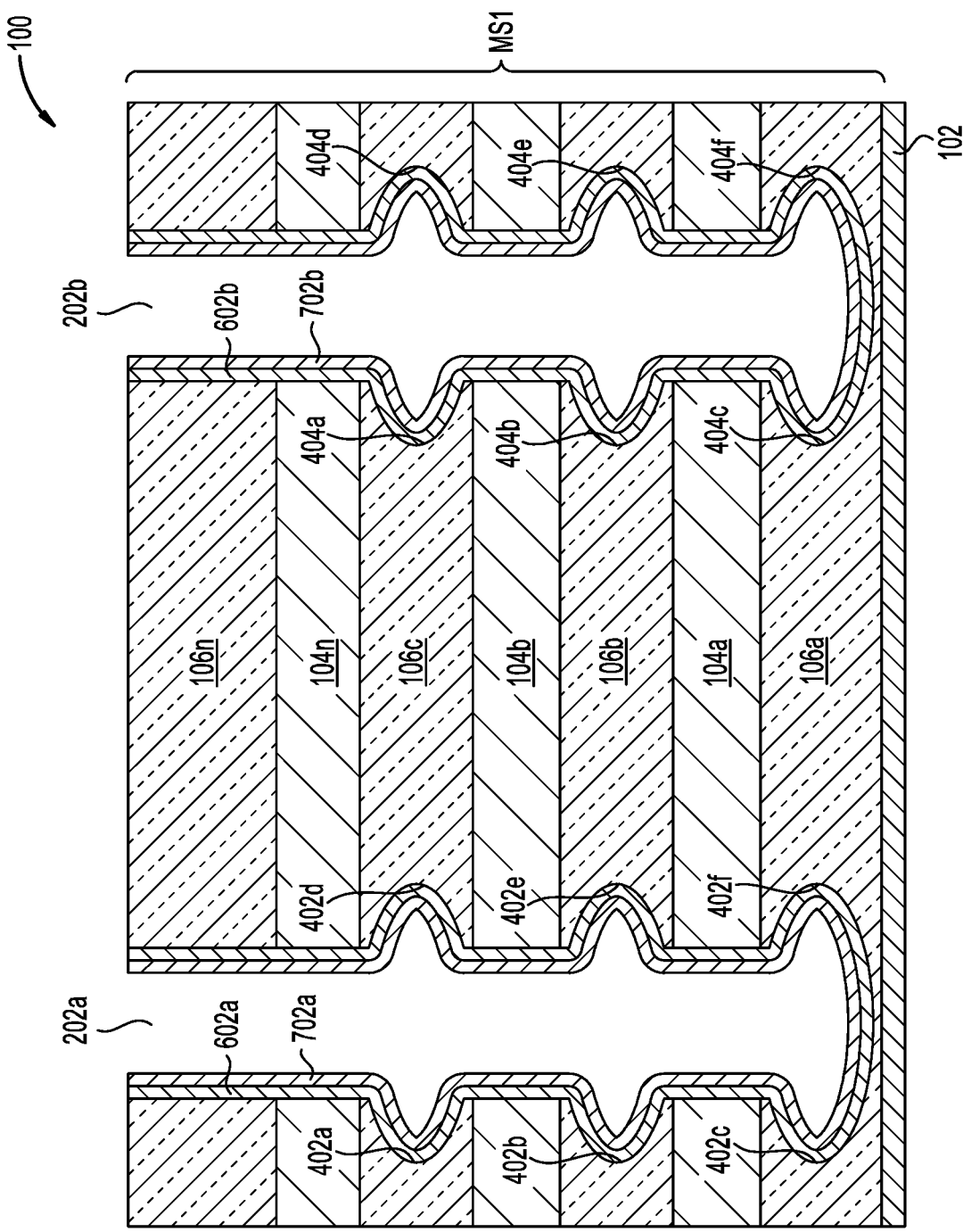
FIG. 7 is a cross sectional view of the exemplary semiconductor structure of FIG. 6 after forming a capacitive dielectric material layer overlying the first conductive layer.

Referring now to FIG. 7, there is illustrated the exemplary semiconductor structure 100 of FIG. 6 after depositing a capacitive dielectric material layer 702a, 702b overlying the first conductive layer 602a, 602b. The capacitive dielectric material layer 702a, 702b is continuous layer that is formed on the entirety of the first conductive layer 602a, 602b. The capacitive dielectric material layer 702a, 702b will subsequently provide the node dielectric of the BEOL capacitor.

The capacitive dielectric material layer 702a, 702b may comprise any dielectric material appropriate for forming a trench capacitor, including but not limited to, silicon dioxide, silicon nitride, silicon oxynitride, a high-k material having a relative permittivity above about 8, or any combination of these dielectric materials. Examples of high-k materials include, but are not limited to, hafnium oxide, hafnium silicon oxide, hafnium silicon oxynitride, aluminum oxide, zirconium oxide, and any combination of these materials.

The capacitive dielectric material layer 702a, 702b may be formed by utilizing a deposition process such as, for example, atomic layer deposition (ALD), molecular layer deposition (MLD), chemical vapor deposition (CVD), or plasma enhanced chemical vapor deposition (PECVD. The capacitive dielectric material layer 702a, 702b follows the contour of the deep trench 202a, 202n and does not entirely fill in the deep trench 202a, 202n. In one embodiment, the capacitive dielectric material layer 702a, 702b has a thickness from 1 nm to 5 nm.

Figure 8:
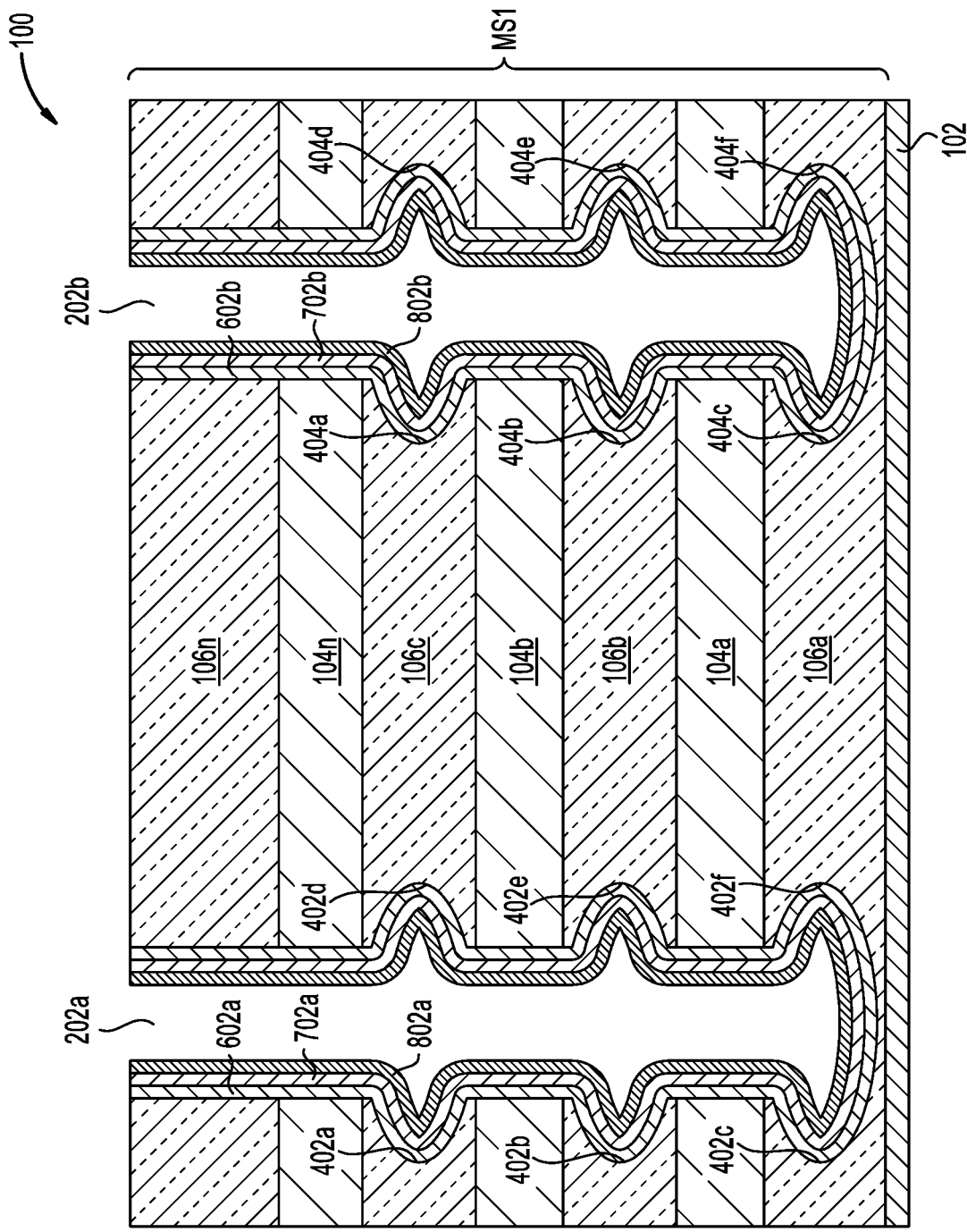
FIG. 8 is a cross sectional view of the exemplary semiconductor structure of FIG. 7 after forming a second conductive layer overlying the capacitive dielectric material layer.

Referring now to FIG. 8, there is illustrated the exemplary semiconductor structure 100 of FIG. 8 after depositing a second conductive layer 802a, 802n overlying the capacitive dielectric material layer 702a, 702b. The second conductive layer 802a, 802n is continuous layer that is formed on the entirety of the capacitive dielectric material layer 702a, 702b but does not entirely fill in the deep trench 202a, 202n.

In one embodiment, the second conductive layer 802a, 802n that is employed in the present application is composed of Ta, TaN, Ti, TiN, Ru, RuN, *RuTa*, RuTaN, W, WN or any other material that can serve as a barrier to prevent a conductive material such as copper from diffusing there through. In some embodiments, the material of the second conductive layer 802a, 802n may include a material stack of such diffusion barrier materials. In one example, the diffusion barrier may be composed of a stack of TaN and Ru.

The second conductive layer 802a, 802n may be formed utilizing a conformal deposition process including, but not limited to, atomic layer deposition (ALD), chemical vapor deposition (CVD) or plasma enhanced chemical vapor deposition (PECVD). The second conductive layer 802a, 802n may include an overburden upper portion that is formed outside the deep trench 202a, 202b.

Figure 9:
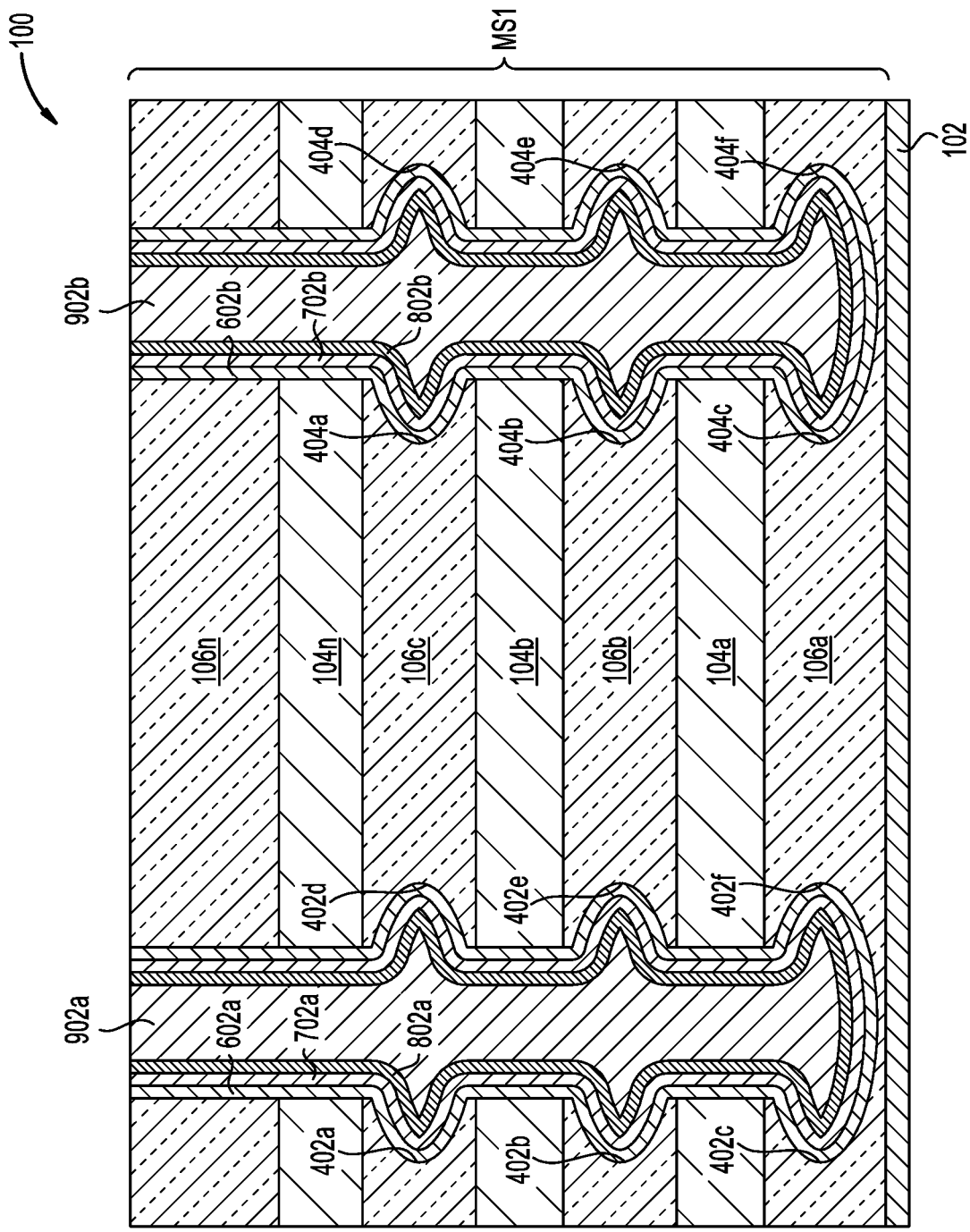
FIG. 9 is a cross sectional view of the exemplary semiconductor structure of FIG. 8 after filling in the remaining portion of the deep trench overlying the entirety of the second conductive layer with a third conductive material.

Referring now to FIG. 9, there is illustrated the exemplary semiconductor structure 100 of FIG. 8 after filling in the remaining portion of the deep trench 202a, 202n overlying the entirety of the second conductive layer 802a, 802n with a third conductive material 902a, 902b. In one embodiment, the third conductive material 902a, 902n differs from the second and first conductive materials. In an embodiment, the third conductive material 902a, 902b is copper.

The third conductive material 902a, 902b can be formed utilizing a deposition process such as, for example, electrochemical deposition or electroplating including electrolytic and electrodeless methods. In some embodiments, the conductive material 902a, 902b can be formed by subsequent deposition of a Cu layer by physical vapor deposition (PVD), chemical vapor deposition (CVD), or atomic layer deposition (ALD) and reflow, at a reflow temperature of 100 C to 500 C. In some embodiments, the conductive material 902a, 902b can be formed by subsequent deposition of a Cu seed layer by PVD (or CVD, or ALD) and a Cu fill layer, which fills the entire feature with Cu, by electroplating. The third conductive layer 902a, 902b may include an overburden upper portion that is formed outside the deep trench 202a, 202b. In some embodiments, a planarization process such as, for example, chemical mechanical polishing, may follow the deposition of the third conductive material 902a, 902b.

Figure 10:
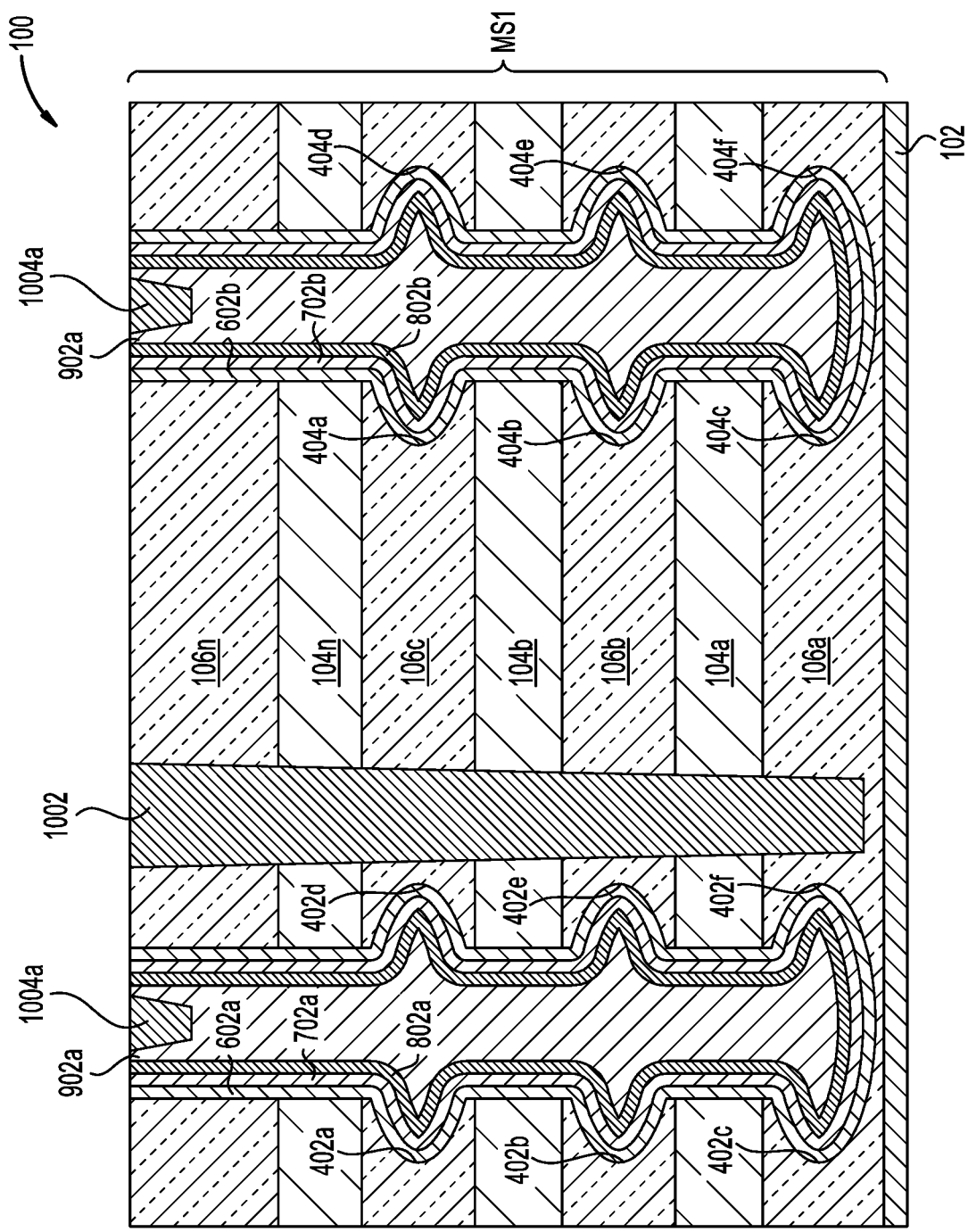
FIG. 10 is a cross sectional view of the exemplary semiconductor structure of FIG. 9 after forming a deep trench contact in a remaining portion of the material stack and shallow trench contacts in the third conductive material.

Referring now to FIG. 10, there is illustrated the exemplary semiconductor structure 100 of FIG. 9 after forming a deep trench contact 1002 in a remaining portion of the material stack MS1 and shallow trench contacts 1004a, 1004b in the third conductive material 902a, 902b. A single deep trench contact 1002 is formed for each BEOL capacitor that is formed. Each deep trench contact 1002 extends from the topmost surface 308a, 308b, 308c of the upper-most dielectric layer 106n to part way into a bottommost ultra low-k dielectric layer 106a but not to the FEOL layer 102. Each of the shallow trench contacts 1004a, 1004b extend from the topmost surface 308a, 308b, 308c of the upper-most dielectric layer 106n to part way into the uppermost dielectric layer 106n but not to the uppermost metallization layer 104n.

Each deep trench contact 1002 and shallow trench contact 1004a, 1004b may include a contact metal or metal alloy such as, for example, copper, aluminum, cobalt, or a copper-aluminum alloy. Each deep trench contact 1002 and shallow trench contact 1004a, 1004b may be formed by first providing a contact trench (not shown) into the material stack MS1 and the third conductive material 902a, 902b, respectively, and then filling the contact trench with a contact metal or metal alloy. The filling of the contact trench may include a deposition process and a planarization process may follow the contact trench fill.

Each deep trench contact 1002 and shallow trench contact 1004a, 1004b has a topmost surface that is coplanar with the topmost surface of each element of the resulting BEOL capacitor as well as the topmost surface 308a, 308b, 308c of the upper-most dielectric layer 106n.

Figure 11:
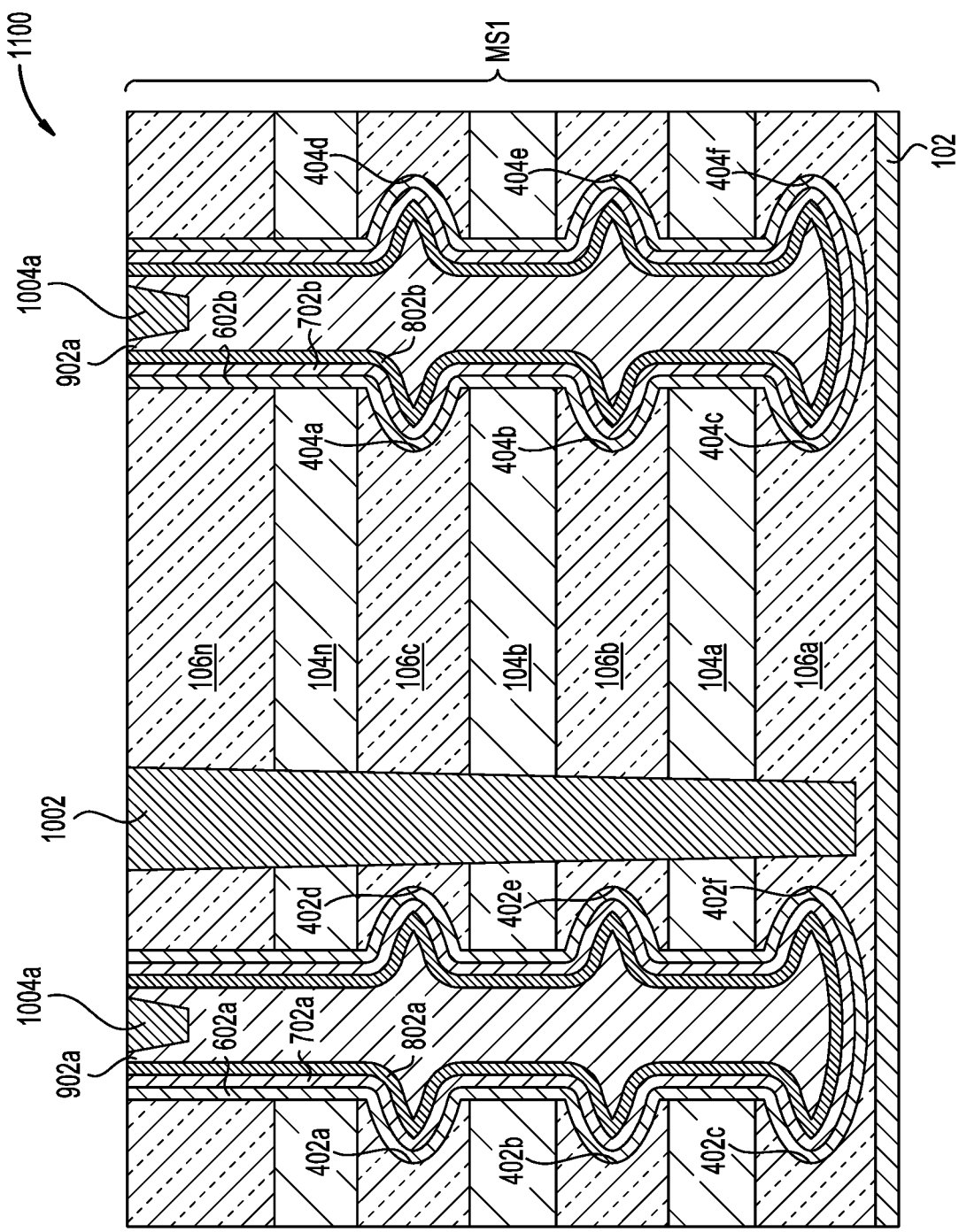
FIG. 11 is a cross sectional view of a BEOL capacitor formed from the semiconductor structure in accordance with an embodiment of the present application.

FIG. 11 illustrates a BEOL capacitor 1100 formed from the semiconductor structure 100 in accordance with an embodiment of the present application. In the illustrated embodiment, the BEOL capacitor 1100 overlies a front-of-the-line semiconductor (FEOL) circuit layer (102). The BEOL capacitor has a deep trench (202a, 202b) formed in a material stack (MS1) comprising alternating vertical (e.g., 304a-304d) and semi-spheroidal sidewall surfaces (402a-402n, 404a-404n). The material stack includes alternating metallization layers (104a-104n) and dielectric layers (106a-106n). At least one of the semi-spheroidal sidewall surfaces is formed in a sidewall of at least one of the dielectric layers in the deep trench. At least one of the vertical sidewall surfaces is a sidewall surface of at least one metallization layer in the deep trench. The material stack overlies the FEOL circuit layer (102). The metallization layers are made of copper. The dielectric layers are made of an ultra-low-k dielectric material.

The at least one deep trench is formed through all of the metallization layers and terminates on a sub-surface (204a, 204b) within a lower-most dielectric layer of the material stack.

Each BEOL capacitor 1100 may be separated and electrically disconnected by a deep trench isolation feature, which may be a deep trench between the contact trench and the next BEOL capacitor. The deep trench crossing all the copper layers, terminating in the lowest level ULK layer. The trench may be filled with an isolating dielectric material, such as ULK. Each BEOL capacitor 1100 has a contact on the capacitor and contact trench and is separated on the left and right by an isolation trench (not shown in drawings).

The BEOL capacitor 1100 further includes a first conductive layer (602a, 602b) made of a diffusion barrier material and a reflow enhancement layer deposited overlying the semi-ovoid sidewall surfaces and the vertical sidewall surfaces of the deep trench. The diffusion barrier material is Ta or TaN. The reflow enhancement layer is a Ru liner. The BEOL capacitor 1100 further includes a capacitive dielectric material layer (702a, 702b) deposited overlying the first conductive layer. The BEOL capacitor 1100 further includes a second conductive layer (802a, 802b) deposited overlying the capacitive dielectric material layer. The second conductive material is ruthenium. The semiconductor structure further includes a third conductive material (902a, 902b) filling in the remaining portion of the deep trench overlying the entirety of the second conductive layer. The third conductive material is copper. The BEOL capacitor 1100 further includes a deep trench contact (1002) formed in a remaining portion of the material stack not including the deep trench and at least one shallow trench contact (1004a, 1004b) in the third conductive material.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A capacitive structure comprising:
   a material stack having a trench formed therein, the material stack comprising alternating vertical and semi-spheroidal sidewall surfaces, wherein the material stack includes alternating metallization layers and dielectric layers, wherein at least one of the semi-spheroidal sidewall surfaces is formed in a sidewall of at least one of the dielectric layers in the trench, and wherein at least one of the vertical sidewall surfaces is a sidewall surface of at least one metallization layer in the trench;
   a first conductive layer made of a diffusion barrier material and a reflow enhancement layer deposited overlying the semi-spheroidal sidewall surfaces and the vertical sidewall surfaces of the trench;
   a capacitive dielectric material layer deposited overlying the first conductive layer;
   a second conductive layer deposited overlying the capacitive dielectric material layer;
   a third conductive material filling in the remaining portion of the trench overlying the entirety of the second conductive layer; and
   a trench contact formed in a remaining portion of the material stack not including the trench and at least one shallow trench contact in the third conductive material.

2. The capacitive structure of claim 1, wherein the metallization layers are made of copper.

3. The capacitive structure of claim 1, wherein the dielectric layers are made of an ultra-low-k dielectric material.

4. The capacitive structure of claim 1, wherein the trench is formed through all of the metallization layers and terminates on a sub-surface within a lower-most dielectric layer of the material stack.

5. The capacitive structure of claim 1, wherein the second conductive layer comprises ruthenium.

6. A semiconductor structure comprising:
   a front-of-the-line semiconductor (FEOL) circuit layer; and
   a back-of-the-line (BEOL) capacitor having a trench formed in a material stack comprising alternating vertical and semi-spheroidal sidewall surfaces, wherein the material stack includes alternating metallization layers and dielectric layers, wherein at least one of the semi spheroidal sidewall surfaces is formed in a sidewall of at least one of the dielectric layers at the trench, wherein at least one of the vertical sidewall surfaces is formed in a sidewall surface of at least one metallization layer at the trench, and wherein the material stack overlies the FEOL circuit layer;
a first conductive layer made of a diffusion barrier material and a reflow enhancement layer deposited overlying the semi-spheroidal sidewall surfaces and the vertical sidewall surfaces of the trench;
a capacitive dielectric material layer deposited overlying the first conductive layer;
a second conductive layer deposited overlying the capacitive dielectric material layer;
a third conductive material filling in the remaining portion of the trench overlying the entirety of the second conductive layer; and
a trench contact formed in a remaining portion of the material stack not including the trench and at least one shallow trench contact in the third conductive material.

\* \* \* \* \*